United States Patent
Aswell et al.

[11] Patent Number: 6,130,569
[45] Date of Patent: Oct. 10, 2000

[54] METHOD AND APPARATUS FOR A CONTROLLED TRANSITION RATE DRIVER

[75] Inventors: Cecil J. Aswell, Orangevale, Calif.; Eugene G. Dierschke, Dallas, Tex.

[73] Assignee: Texas Instruments Incorporated, Dallas, Tex.

[21] Appl. No.: 09/052,584

[22] Filed: Mar. 31, 1998

Related U.S. Application Data

[60] Provisional application No. 60/042,889, Mar. 31, 1997.

[51] Int. Cl.[7] .................................................. H03K 17/04
[52] U.S. Cl. .......................................... 327/374; 327/108
[58] Field of Search .......................... 327/108–112, 374, 327/376, 377, 437, 551, 554

[56] References Cited

U.S. PATENT DOCUMENTS

| | | | |
|---|---|---|---|
| 5,546,029 | 8/1996 | Koke | 327/108 |
| 5,646,561 | 7/1997 | Fanini et al. | 327/110 |

*Primary Examiner*—Kenneth B. Wells
*Assistant Examiner*—Minh Nguyen
*Attorney, Agent, or Firm*—Alan K. Stewart; Wade James Brady, III; Richard L. Donaldson

[57] ABSTRACT

A driver circuit (12) having a controlled transition rate is provided. The driver circuit (12) includes a first device (56) operable to switch a supply voltage to load. A second device (54) is coupled to an input for the first device (56) in source follower arrangement. A third device (66), coupled to the input for first device (56) and an output for the second device (54), is operable to function as a Miller amplifier in conjunction with the first device (56). A fourth device (152) is coupled to an input of the second device (54). The fourth device (152) is operable to function as a Miller amplifier in conjunction with the first device (56) and the second device (54). A capacitor (68) is coupled between an output for the first device (56) and inputs for the third device (66) and the fourth device (152). The capacitor (68) is operable to function as a Miller capacitor to control transition rates at the output of the first device (56).

10 Claims, 2 Drawing Sheets

METHOD AND APPARATUS FOR A CONTROLLED TRANSITION RATE DRIVER

This application claims priority under 35 USC § 119(e)(1) of provisional application Ser. No. 60/042,889 filed Mar. 31, 1997.

CROSS-REFERENCE TO RELATED PATENT APPLICATIONS

This patent is related to the following co-pending patent applications: Ser. No. 09/052,596, entitled Method and Apparatus for a Temperature Compensation Circuit, Attorney's Docket TI-25697; and Ser. No. 09/052,585, entitled Method and Apparatus for a Reduced Propagation Delay Driver, Attorney's Docket TI-25696. Each of the above entitled co-pending applications is assigned to Texas Instruments Incorporated.

TECHNICAL FIELD OF THE INVENTION

This invention relates in general to the field of electronic systems, and more particularly to a method and apparatus for a controlled transition rate driver.

BACKGROUND OF THE INVENTION

In the design of integrated circuit systems, square wave logic level signals are used throughout the systems to communicate information and to trigger events. However, the rapid rise and fall times of square wave signals produce electromagnetic radiation. The faster the rise or fall transition rates, the higher the electromagnetic radiation. Likewise, the higher the current or voltages being changed, the higher the electromagnetic radiation. In many applications, this electromagnetic radiation can cause interference with other electrical systems. This phenomenon is referred to as electromagnetic interference (EMI).

In electronic applications with switching circuitry it is necessary to minimize the electromagnetic radiation which causes electromagnetic interference in other electronic devices. One method of lowering EMI is limiting the rise and fall transition times of signals generated by switches in the circuitry. This is especially true of switches which drive wires or cables where radiation cannot be easily suppressed with shielding techniques. The switching circuitry must control the rise and fall transition times of the switched signals such that they are slow enough to prevent unacceptable EMI radiation but not so slow as to degrade the performance of the system.

Switching may be accomplished by various kinds of driver circuits in modern electronic devices. A "high side" drive circuit drives, or switches, a positive supply to a load; this kind of driver is not required to sink significant currents when driving low. A "low side" driver, drives, or switches, a negative supply to a load. A "totem pole" driver is a hybrid of the low and high side drivers in which the driver alternately switches a load to a positive supply and a negative supply.

Prior driver circuits suffered from numerous disadvantages. One disadvantage in prior driver circuits is that they do not control the transition rates of the switched voltage or current to the tight tolerances required for many modern electronic applications. Another disadvantage of prior driver circuits is that the transition rate often varies depending upon the size of the voltage or current switched, thereby causing timing variations in the switch. A further disadvantage is that prior driver circuits do not adequately control the rise and fall transition rates within a tight tolerance of maximum and minimum times that is required while switching a voltage or current that may vary over a wide range.

SUMMARY OF THE INVENTION

Accordingly, a need has arisen in the art for an improved driver with controlled transition rates. The present invention provides a controlled transition rate driver that addresses shortcomings of prior driver circuits.

In accordance with the teachings of the present invention, a driver circuit having a controlled transition rate is provided. The driver circuit includes a first device operable to switch a supply voltage to load. A second device is coupled to an input for the first device in source follower arrangement. A third device, coupled to the input for first device and an output for the second device, is operable to function as a Miller amplifier in conjunction with the first device. A fourth device is coupled to an input of the second device. The fourth device is operable to function as a Miller amplifier in conjunction with the first device and the second device. A capacitor is coupled between an output for the first device and inputs for the third and fourth devices. The capacitor is operable to function as a Miller capacitor to control transition rates at the input of the first device.

For some applications, embodiments of the present invention may preferably be manufactured using CMOS technology. However, other technologies may be used to manufacture a controlled transition rate driver in accordance with teachings of the present invention.

Technical advantages of the present invention include providing a driver circuit with controlled rise and fall transition times wherein the rise and fall transition times are essentially equal and defined by a single set of parameters.

Another technical advantage of the present invention is a driver circuit having controlled rise and fall transition times which are essentially independent of the voltage being switched.

A further technical advantage of the present invention includes providing a driver circuit in which the variation of the rise and fall transition times are within a tighter maximum and minimum tolerance than could be obtained with prior drivers.

Other technical advantages will be readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1:
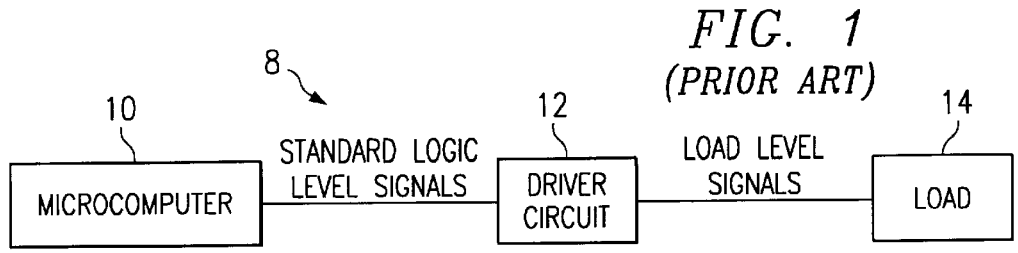
FIG. 1 is a block diagram of a typical electronic device that utilizes a microcontroller to control a high voltage/high current load.

FIG. 1 is a block diagram showing a typical electronic device 8 that utilizes a microprocessor 10 to control the on/off switching of high voltage/high current, load level signals to a load 14. Microprocessor 10 controls the load level signals to load 14 through a driver circuit 12. Driver circuit 12 receives low voltage logic level control signals from microprocessor 10 and converts these signals into load level signals used to control load 14. Load 14 may be any kind of electronic device such as a motor, resistor or capacitor. Driver circuit 12 allows a microprocessor 10 to control motors and other high voltage/high current devices that microprocessor 10 could not control directly.

Figure 2:
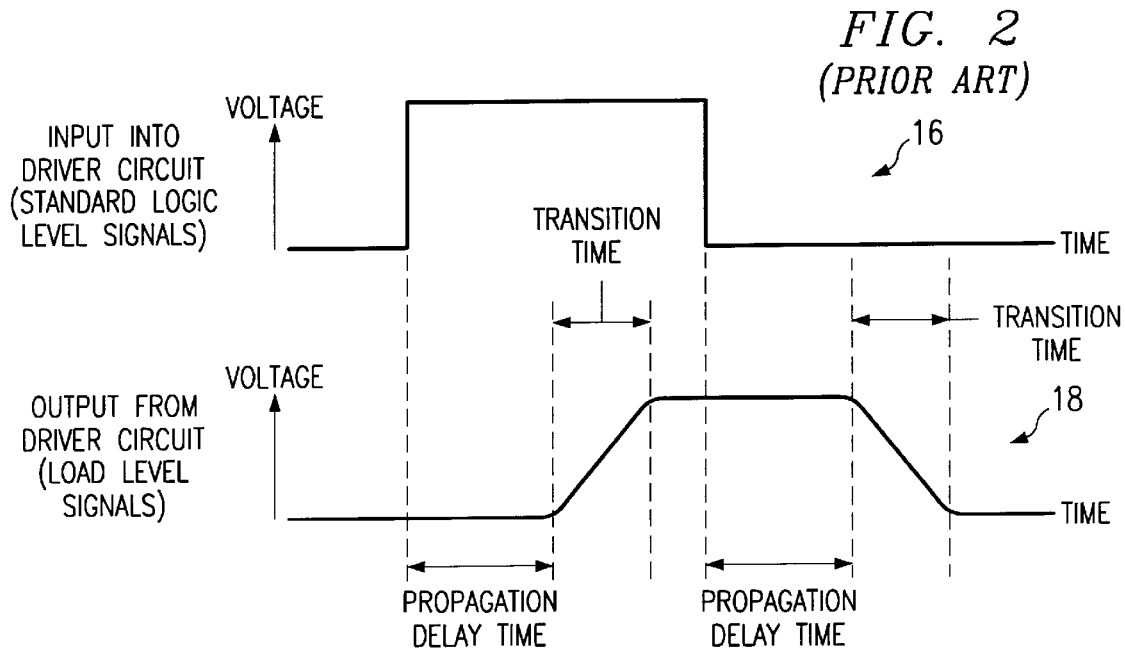
FIG. 2 is a timing diagram illustrating an exemplary logic level control signal which may be received by a driver circuit and an exemplary load level signal output by the driver circuit in response.

FIG. 2 is a timing diagram illustrating an exemplary logic level control signal 16 which may be received by a typical driver circuit and an exemplary load level signal 18 output by the driver circuit in response. Logic level control signal 16 can be a low voltage control signal output from microprocessor 10 and input into driver circuit 12 shown in FIG. 1. Load level signal 18 can be a high voltage/high current, load level signal, which is output from driver circuit 12 in response to the control signal from microprocessor 10. The timing diagram shows the rise and fall transition times and also the propagation delay times. Transition times may be defined as the time it takes for the output load level signal to change between 10% and 90% of its final value. The propagation delay time may be defined as the difference in time between a change in the input logic level control signal and the moment that the output load level signal has changed 10% of its final value.

Figure 3:
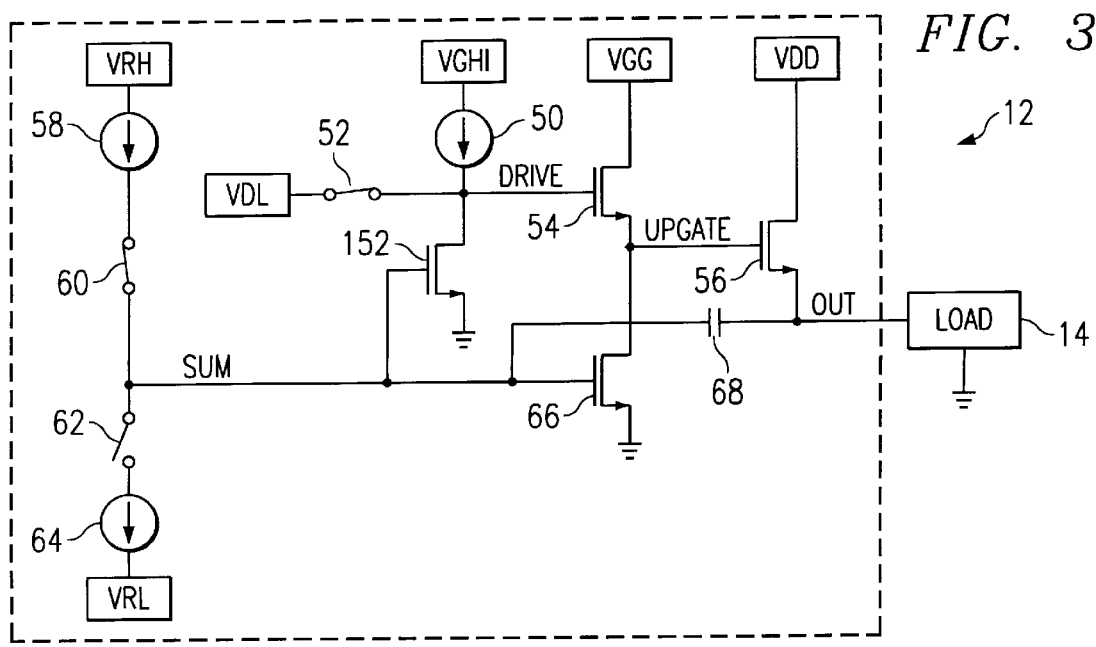
FIG. 3 is a schematic diagram of a driver circuit, according to one embodiment of the present invention.

FIG. 3 is a schematic diagram of a driver circuit 12, according to one embodiment of the present invention. As shown, driver circuit 12 includes a device 56. Device 56 can be a large high current, high voltage lateral DMOS device with low on-resistance which switches a supply VDD to a load 14. The output or source of device 56 is coupled to node OUT, which constitutes the output voltage of driver circuit 12. A supply VGG (VGG>VDD) is used to power a gate drive circuit for device 56. A supply VGHI (VDD<VGHI<VGG) may be a temperature compensated reference supply, as described in copending patent application Ser. No. 09/052,596, entitled Method and Apparatus for Temperature Compensation Circuit, Attorney's Docket, TI-25697, and incorporated by reference herein. Such temperature compensated reference supply VGHI controls the amount of gate drive applied to device 56.

The output or source of a device 54 is coupled to the input of device 56. Device 54 is used as a source follower buffer so that the gate current drive for device 56 can be obtained from supply VGG instead of from supply VGHI. Node UPGATE voltage is dependent on supply VGHI through current source 50 and device 54. A device 66 is coupled to the input of device 56 and the source or output of device 54 at a node UPGATE. Device 66 is used to control the voltage at node UPGATE. A device 152 is coupled to the gate or input of device 54 at a node DRIVE. Device 152 is used to control the voltage at node DRIVE. A capacitor 68 is coupled between the output of device 56 (at node OUT) and the gates or inputs of devices 66 and 152 (at a node SUM). Capacitor 68 is used as a Miller feedback capacitor between nodes OUT and SUM. A supply VRH is a reference supply sufficiently large to ensure that devices 66 and 152 are turned on when such supply is applied to their inputs at node SUM. A supply VRL is a reference supply sufficiently small to ensure that devices 66 and 152 are turned off when applied to their inputs.

A current source 50 is coupled between supply VGHI and the input of device 54 at node DRIVE. A current source 58 is coupled between supply VRH and a switch 60. A current source 64 is coupled between a switch 62 and supply VRL.

Current sources 50, 58, and 64 are used to control drive circuit 12. Switches 60 and 62 are used to connect the current sources 58 and 64 to node SUM. A switch 52 is connected between node DRIVE and a supply VDL. Supply VDL is a reference supply sufficiently small to ensure that device 54 is turned off when applied to the input of device 54. The embodiment of driver circuit 12 shown in FIG. 3 is used to control the negative and positive transition times of the load level signals at node OUT which constitutes the output voltage of driver circuit 12. It must be understood that in other embodiments the drain, rather than the source, of a device may be that device's output.

The embodiment of driver circuit 12 shown in FIG. 3 operates as follows. Initially the output of drive circuit 12 will be in an off-state (as shown in FIG. 3). More specifically, switches 60 and 52 are closed and switch 62 is open so that devices 66 and 152 are turned on, thereby causing nodes DRIVE and UPGATE to be low. Because nodes DRIVE and UPGATE are low, devices 54 and 56 will be turned off. In the off-state, no current flows in load 14.

To turn on output device 56, the position of the various switches are changed. Switches 60 and 52 are opened and switch 62 is closed pulling node SUM low, thereby turning off devices 66 and 152. This allows nodes DRIVE and UPGATE to go high, thus turning on devices 54 and 56. Capacitor 68 functions as a Miller feedback capacitor between nodes OUT and SUM. Node SUM will be a relatively constant voltage during the switching transient. Device 152 functions as a relatively high gain inverting amplifier or Miller amplifier with a two-stage source follower comprising devices 54 and 56. The output voltage transition rate is a function of current source 64 and capacitor 68 and is defined as the current output by current source 64 divided by the value of capacitor 68 (i.e., $I_{64}/C_{68}$)

To turn off output device 56, the position of the various switches are changed back to that shown in FIG. 3. Node SUM is driven high by current source 58, thus turning on devices 152 and 66. This in turn causes nodes DRIVE and UPGATE to be pulled low. During the switching transition, device 66 is in the saturation region of operation. In this case, device 66 functions as a relatively high gain single stage inverting amplifier or Miller amplifier with a source follower comprising device 56. Again, capacitor 68 functions as a Miller feedback capacitor between nodes OUT and SUM. Node SUM will be at a relatively constant voltage during the switching transient. The output voltage transition rate during the transient will be determined by current source 58 and capacitor 68 and is defined as the current output by current source 58 divided by the value of capacitor 68 (i.e., $I_{58}/C_{68}$)

From the above, it can be seen that the output voltage transition rates during the turn-on and turn-off transitions can be made equal by setting the value of current sources 58 and 64 to be the same (i.e., $I_{58}=I_{64}$). Accordingly, the present invention controls the transition rates in driver circuit 12.

Although driver circuit 12 is illustrated and described as a high side driver with reference to FIG. 3, the inventive concept of the present invention may also apply to other driver circuits, such as a low side drivers or a totem pole drivers. Additionally, although the above circuitry is shown and described as utilizing CMOS devices, the present inventive concept may also be implemented using any other suitable devices, such as bipolar devices or BiCMOS devices.

Figure 4:
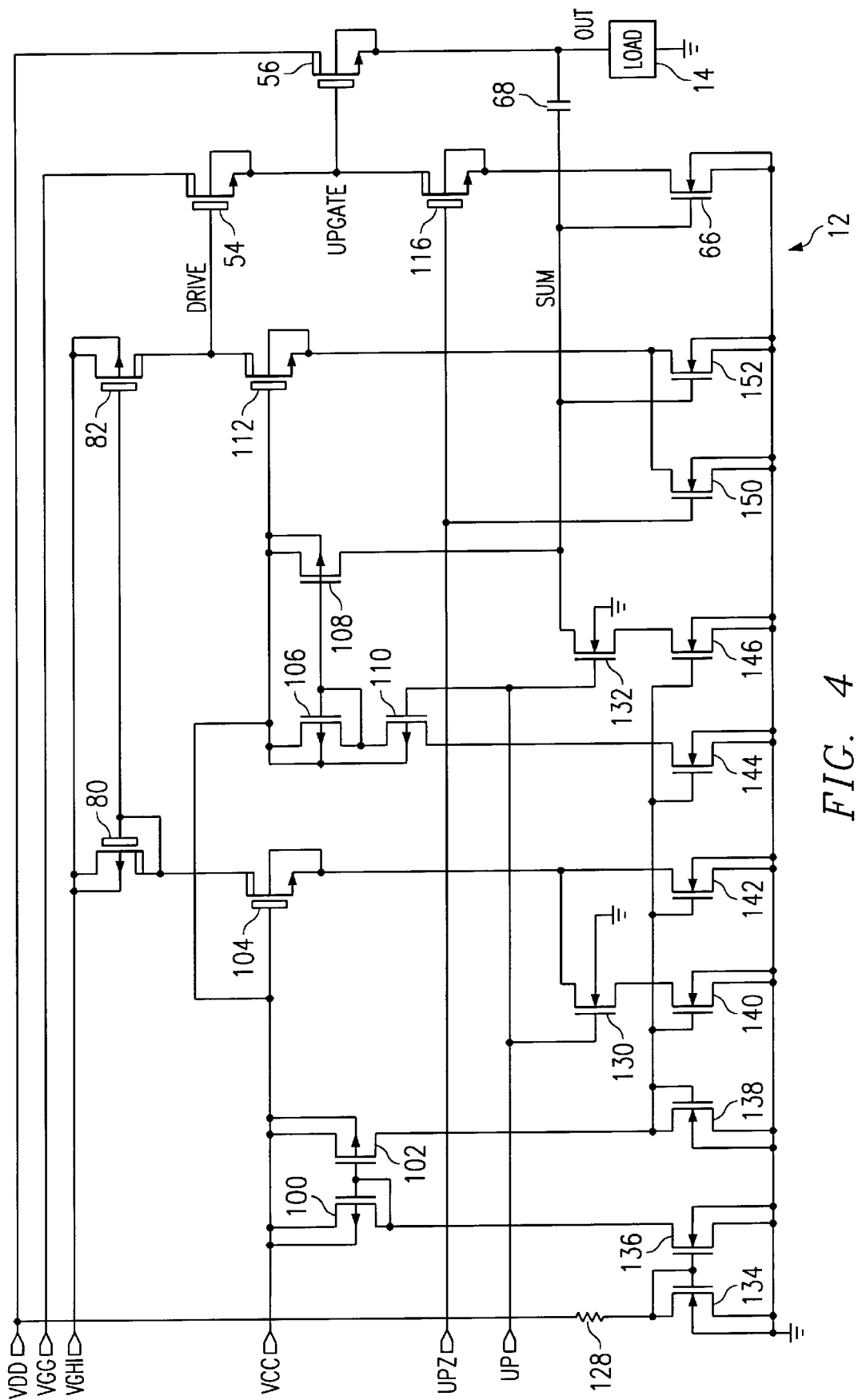
FIG. 4 is a schematic diagram of a driver circuit, according to another embodiment of the present invention.

FIG. 4 is a schematic of another embodiment of a high side driver 12 according to the present invention. FIG. 4 incorporates the teachings of copending patent application Ser. No. 09/052,596, entitled Method and Apparatus for a Temperature Compensation Circuit, Attorney's Docket TI-25697; and copending patent application Ser. No. 09/052,585, entitled Method and Apparatus for a Reduced Propagation Delay Driver, Attorney's Docket TI-25696, each of which are incorporated into this application by reference.

As shown in FIG. 4, high side driver 12 includes a device 56 which can be a large high current, high voltage lateral DMOS device which switches a supply VDD to load 14. The source of device 56 is coupled to a node OUT which constitutes the output of driver circuit 12 to load 14. A device 54 is coupled the gate of device 56 and acts as a gate drive circuit for device 56. Device 54 is used as a source follower buffer so that the gate current drive for device 56 can be obtained from supply VGG instead of from supply VGHI. Node UPGATE voltage is dependent on node VGHI voltage through current source 50 and device 54. Supply VGHI may be a temperature compensated reference supply for controlling the amount of gate drive applied to device 56. Supply VCC may be a nominal 5 volt supply for powering the low voltage part of the circuitry. Input signals UP and UPZ may be complementary 5 volt logic signals supplied from microcontroller 10. Node OUT is the high current/high voltage output to load 14.

During output transitions, device 56 functions as a source follower with a resistive load. The key to controlling the rise and fall transition times accurately is to control the rise and fall times of node UPGATE. In its simplest logic function, node UPGATE goes high when input UP goes high and goes low when UP goes low. (UP and UPZ are complementary signals.) Node UPGATE is driven high when the gate of device 54, node DRIVE, goes high, and is pulled low by device 66 through cascode switch device 116.

To understand the functionality of this circuit, assume the device is in a steady state with input UP low and UPZ high, thereby signaling node OUT to be in an off state. A current flows through resistor 128 and diode-connected device 134 which is equal to $$I_{128} = \frac{VDD - VGS_{134}}{R_{128}}$$

Since $VGS_{134}$ is much less than VDD, the current is approximately proportional to VDD.

This current is mirrored through devices 136, 100 and 102 to diode-connected device 138, which sets up proportional currents in devices 140, 142, 144, and 146. Current from device 144 is mirrored through devices 110/106 by device 108 into node SUM. Because UP is low, device 132 is off and therefore node SUM goes high, turning on devices 152 and 66. Device 130 is turned off. Device 150 is turned on by UPZ, sinking the current from current source 82 through cascode device 112 and consequentially pulling the gate of device 54 node DRIVE low. This turns off device 54. At the same time, node UPGATE is pulled low by device 66 through cascode device 116, causing device 56 to be turned off.

Now assume inputs UP and UPZ change states. Device 130 turns on, increasing the current through cascode device 104 and diode-connected device 80. This increased current is mirrored through device 82. At the same time, device 110 is turned off since its gate is connected to node UP. This shuts off the current through device 106 and hence through device 108, causing the current from device 108 into node SUM to go to zero. Device 132 turns on allowing current source 146 to pull node SUM low. Pulling SUM low turns off devices 152 and 66, allowing the gate of device 54, node DRIVE, to go high and causing node UPGATE to go high and turn on device 56. Device 150 is turned off since its gate is connected to UPZ.

To control both the positive and negative output transition times, Miller feedback capacitor 68 is used to control the rise and fall times of node UPGATE. Consider the falling transition where the output is being switched from high (device 56 turned on) to low (device 56 turned off). Node UPGATE is pulled low by device 66, causing the output to go low. The gate of device 66, node SUM, is driven high by a current source, device 108. During the switching transition, device 66 may be in the saturation region of operation, which makes it a relatively high gain single stage inverting amplifier with a source follower comprising device 56. Miller capacitor 68 functions as a Miller feedback capacitor between nodes OUT and SUM. Node SUM will be at a relatively constant voltage during the switching transient. The transition rate during the transient will be determined by the current from device 108 and the size of Miller capacitor 68 and will be given by $$\frac{dv}{dt} = \frac{I_{108}}{C_{68}}$$

In the rising transition, where the output is being switched from low (device 56 turned off) to high (device 56 turned on) a similar situation occurs, except in this case, current is being pulled from node SUM by device 146 through device 132 which is now turned on. Device 152 now functions as a Miller amplifier with a two stage source follower (devices 54 and 56). The output transition rate in this case is given by $$\frac{dv}{dt} = \frac{I_{146}}{C_{68}}$$

Since devices 106 and 108 are identical devices the current from device 108 will be the same as device 106. The current through device 106 is set by device 144. Device 144 is identical to device 146. Therefore, $I_{46}=I_{108}$ and the transition rates of the positive and negative transitions will be the same.

The total rise or fall time will be determined by the transition rate dv/dt and the magnitude of the transition $\Delta v$:

$$\Delta t = \frac{\Delta v}{dv/dt}$$

Where $\Delta v$ is equal to the supply voltage VDD less a negligible drop across device 56 when it is completely turned on. If the transition rate is made proportional to $\Delta v$, the rise time will be a constant for any $\Delta v$. This is done by making the currents governing dv/dt proportional to VDD. Both $I_{108}$ and $I_{146}$ are set by the current through resistor 128 which, as described above, is approximately proportional to VDD. Since these currents are proportional to VDD, the output rise and fall transition times are independent of VDD.

Although the present invention and its advantages have been described in detail, it should be understood that various changes, substitutions, and alterations can be made therein without departing from the spirit and scope of the present invention as defined by the appended claims. For example, driver circuit 12 has been described as a "high side" driver. However, the inventive concept may also apply to other drivers, such as "low side" or "totem-pole" drivers.

Although the present invention has been described with several embodiments, various changes and modifications may be suggested to one skilled in the art. It is intended that the present invention encompass such changes and modifications as fall within the scope of the following claims.

What is claimed is:

1. A driver circuit having a controlled transition rate, the driver circuit comprising:
    a first device operable to switch a supply voltage to load;
    a second device coupled to an input of the first device in source follower arrangement;
    a third device coupled to the input of the first device and an output of the second device, the third device operable to function as a first Miller amplifier in conjunction with the first device;
    a fourth device coupled to an input of the second device, the fourth device operable to function as a second Miller amplifier in conjunction with the first device and the second device;
    a capacitor coupled between an output of the first device and inputs of the third and fourth devices, the capacitor operable to function as a Miller capacitor to control transition rates at the output of the first device;
    a first current source having a first value;
    a first switch operable to connect the first current source to the inputs of the third and fourth devices;
    a second current source having a second value; and
    a second switch operable to connect the second current source to the inputs of the third and fourth devices.

2. The driver circuit of claim 1, wherein the first device comprises a lateral DMOS device.

3. The driver circuit of claim 1, further comprising a third current source coupled to the input of the second device.

4. The driver circuit of claim 1, wherein the first current source is coupled to a first reference supply voltage, the first reference supply voltage sufficient to ensure that the third and the fourth devices are turned on when the first switch is closed.

5. The driver circuit of claim 1, wherein the second current source is coupled to a second reference supply voltage, the second reference supply voltage sufficient to ensure that the third and the fourth devices are turned off when the second switch is closed.

6. The driver circuit of claim 1, further comprising a third switch operable to connect the input of the second device to a third reference supply voltage, the third reference supply voltage sufficient to ensure that the second device is turned off when the third switch is closed.

7. A driver circuit having a controlled transition rate, the driver circuit comprising:
    a first device operable to switch a supply voltage to load;
    a second device coupled to an input of the first device in source follower arrangement;
    a third device coupled to the input of the first device and an output of the second device, the third device operable to function as a first Miller amplifier in conjunction with the first device;
    a fourth device coupled to an input of the second device, the fourth device operable to function as a second Miller amplifier in conjunction with the first device and the second device;
    a first current source having a first value;
    a first switch operable to connect the first current source to inputs of the third and fourth devices;
    a second current source having a second value;
    a second switch operable to connect the second current source to the inputs of the third and fourth devices;
    a capacitor coupled between an output of the first device and the inputs for the third and fourth devices, the capacitor operable to function as a Miller capacitor to control transition rates at the input of the first device;
    a third current source coupled to the input of the second device; and
    a third switch operable to connect the input of the second device to a third reference supply voltage, the third reference supply voltage sufficient to ensure that the second device is turned off when the third switch is closed.

8. The driver circuit of claim 7, wherein the first device comprises a lateral DMOS device.

9. The driver circuit of claim 7, wherein the first current source is coupled to a first reference supply voltage, the first reference supply voltage sufficient to ensure that the third and the fourth devices are turned on when the first switch is closed.

10. The driver circuit of claim 7, wherein the second current source is coupled to a second reference supply voltage, the second reference supply voltage sufficient to ensure that the third and the fourth devices are turned off when the second switch is closed.

* * * * *